United States Patent [19]

Bartlett et al.

[11] Patent Number: 4,508,591
[45] Date of Patent: Apr. 2, 1985

[54] POLYMETHYL METHACRYLATE COMPATIBLE SILICON DIOXIDE COMPLEXING AGENT

[75] Inventors: Keith G. Bartlett; Mary A. Caolo, both of Ft. Collins, Colo.

[73] Assignee: Hewlett-Packard Company, Palo Alto, Calif.

[21] Appl. No.: 587,348

[22] Filed: Mar. 8, 1984

[51] Int. Cl.³ ................... B44C 1/22; C03C 15/00; C03C 25/06

[52] U.S. Cl. .................... 156/659.1; 156/653; 156/657; 156/661.1; 156/662; 252/79.3; 252/79.4

[58] Field of Search ............... 252/79.3, 79.4; 156/644, 653, 657, 659.1, 662, 661.1; 430/313, 317

[56] References Cited

U.S. PATENT DOCUMENTS

| | | | |
|---|---|---|---|
| 4,362,809 | 12/1982 | Chen | 430/312 |
| 4,395,304 | 7/1983 | Kern et al. | 156/657 |

FOREIGN PATENT DOCUMENTS 2529865 1/1977 Fed. Rep. of Germany ..... 252/79.4

OTHER PUBLICATIONS

"A Study of the Dissolution of SiO₂ in Acidic Fluoride Solutions", John S. Judge, J. Electrochem. Soc., vol. 118, p. 1772, (1971).
"Tapered Windows in SiO₂: The Effect of NH₄F:HF Dilution and Etching Temperature", G. I. Parisi, S. E. Haszko, and G. A. Rozgonyi, J. Electrochem. Soc., vol. 124, p. 917, (1977).
"A New Technology for Tapered Windows in Insulating Films", Hirosh Ono and Hiroyuki Tango, J. Electrochem. Soc., vol. 126, p. 504, (1979).
"Etch Rate Characterization of Silane Silicon Dioxide Films", Lou Hall, J. Electrochem. Soc., vol. 118, p. 1506, (1971).
"Etch Rates of Doped Oxides in Solutions of Buffered HF", A. S. Tenney and M. Ghezzo, J. Electrochem. Soc., vol. 120, p. 1091, (1973).
"Etching Studies of Diffusion Source Boron Glass", Lillian Rankel Plauger, J. Electrochem. Soc., vol. 120, p. 1428, (1973).
"Enhanced GaAs Etch Rates Near the Edges of a Protective Mask", Don W. Shaw, J. Electrochem. Soc., vol. 113, p. 958, (1966).
"Preferential Etching of GaAs Through Photoresist Masks", Mutsuyuki Otsubo, Takao Oda, Hisao Kumabe and Hidojiro Miki, J. Electrochem. Soc., vol. 123, p. 676, (1976).
"A Correlation Between Etch Characteristics of GaAs Etch Solutions Containing H₂O₂ and Surface Film Characteristics", E. Kohn, J. Electrochem. Soc., vol. 127, p. 505, (1980).
"The Influence of the Complexing Agent Concentration on the Etch Rate of Germanium", Michael F. Ehman, J. W. Faust, Jr., and William B. White, J. Electrochem. Soc., vol. 118, p. 1443, (1971).
"Activation Energies in the Chemical Etching of Semiconductors in HNO₃–HF–CH₃COOH", A. F. Bogenschutz, N. Krusemark, K. H. Locherer and W. Mussinger, J. Electrochem. Soc., vol. 114, p. 970, (1967).
"Chemical Etching of Silicon II. The System HF, HNO₃, H₂O, and HC₂H₃O₂", H. Robbins and B. Schwartz, J. Electrochem. Soc., vol. 107, p. 108, (1960).
"Etching of Germanium and Silicon", Pei Wang, The Sylvania Technologist, vol. 11, p. 50, (1958).
"Chemical Etching of Silicon III. A Temperature Study in the Acid System", B. Schwartz and H. Robbins, J. Electrochem. Soc., vol. 108, p. 365, (1961).

Primary Examiner—William A. Powell
Attorney, Agent, or Firm—Bloor Redding, Jr.

[57] ABSTRACT

An etching solution for the dissolution of silicon dioxide through a portable conformable mask, with PMMA as the etch stop layer, has been developed which eliminates resist lifting and non-uniform lateral etching, thereby providing the improved oxide edge definitions required for 1 micron line geometries in VLSI chips.

4 Claims, 5 Drawing Figures

POLYMETHYL METHACRYLATE COMPATIBLE SILICON DIOXIDE COMPLEXING AGENT

BACKGROUND

A manufacturable, high resolution photoresist process is essential for the development of VLSI circuits. Single layer photoresist processes known in the art are capable of fine resolution when used on smooth, low reflectivity substrates. Unfortunately, the process of manufacturing integrated circuits creates a complex surface of widely varying reflectivities. This has mandated the development of alternative photoresist processes.

One such process is the portable conformal mask process (PCM). This process is a two layer resist process. The first resist layer is applied in sufficient thickness to planarize the substrate. The second resist layer is a standard resist layer, which is applied in uniform thickness. Then, the second resist layer is exposed and developed. Finally, the first resist layer is exposed and developed. With the mask in place, the chemical processing steps begin. One common process involves etching silicon dioxide which is used as an insulator in the construction of integrated circuits.

Silicon dioxide, or glass, is very difficult to etch. Ammonium fluoride has been the primary ingredient in all silicon dioxide etchants. In order to increase the pH stability of such etchants, the prior art has taught the addition of two ingredients, either hydrogen fluoride or acetic acid.

However, severe line width problems are encountered when films of phosphorous doped or undoped silicon dioxide masked with the PCM technique are etched with these standard buffered etch solutions. Use of the standard etch caused the first resist layer to lift, thereby permitting the etchant to etch portions of the silicon dioxide film which were not intended to be etched. Furthermore, the standard etchant also caused severe undercutting which prevents the accurate control of line widths required for VLSI circuits.

Prior art solutions to such problems have included: (1) attempting to improve resist adhesion to the silicon dioxide; (2) formulating the best developer conditions; (3) determining the optimum hard bake temperature; and (4) varying the concentration of ammonium fluoride and acetic acid or hydrogen fluoride in the etchant solution. Each of these attempted solutions has failed to resolve the problem of maintaining very narrow line widths to the high degree of uniformity and accuracy demanded by the VLSI process.

SUMMARY

In accordance with the preferred embodiment of the present invention, a method is provided for etching 1 micron lines in silicon dioxide through a portable conformal mask. The method involves the use of the aqueous solution of ammonium fluoride and a new complexing agent.

The present method is superior to the prior art in several ways. First, the method eliminates lifting of the etch stop layer which was prevalent when using prior art etchant solutions, thereby permitting a process with resolution of 1 micron lines. Second, the method eliminates the severe undercutting of the resist layer which occurred in the rare instances in which prior art techniques used to enhance resist bonding to the silicon dioxide were successful.

DESCRIPTION OF THE PREFERRED EMBODIMENT

Figure 1:
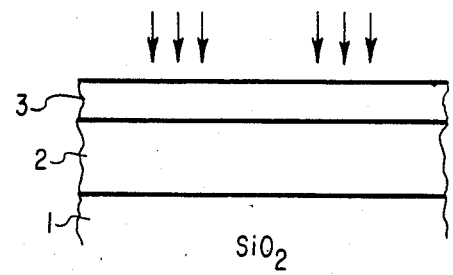
FIG. 1 illustrates the top layer exposure step of a portable conformal mask process for etching silicon dioxide.
Figure 2:
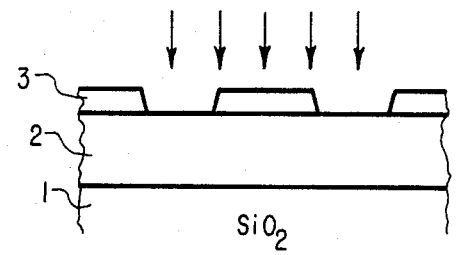
FIG. 2 illustrates the bottom layer exposure step of a portable conformal mask process.
Figure 3:
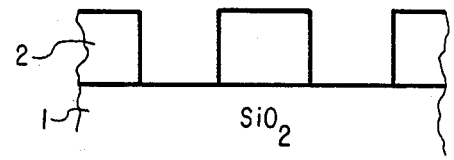
FIG. 3 illustrates the resist pattern which results from a portable conformal mask process in which the top layer has been removed during development of the bottom layer.

The portable conformal mask process is outlined in FIGS. 1 through 3. Referring to FIG. 1, a layer of polymethyl methacrylate 2 (also known as PMMA and available from DuPont Company, Wilmington, Del. 19898) is coated on the silicon dioxide substrate 1 in sufficient thickness to planarize the substrate and is then soft baked. The PMMA layer 2 is then coated with a second layer of photoresist 3, a positive near ultraviolet photoresist. Since the PMMA layer 2 has planarized the substrate 1, the exposure system has a uniform top layer thickness to expose. Both resist layers are then hard baked. Next, the top layer is exposed and developed. Referring to FIG. 2, the developed top layer 3, which must absorb strongly in the PMMA sensitive region of 200–250 nm, acts as a conformal contact mask during the flood exposure of PMMA layer 2 with deep ultraviolet light. Referring to FIG. 3, the PMMA layer 2 is now developed, and used as the photoresist stop layer for further processing. Typically, the top layer of standard resist 3 is removed at the same time the PMMA layer 2 is developed.

Figure 4:
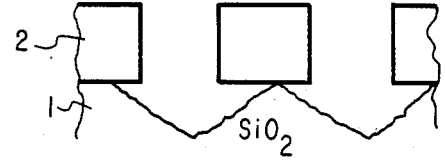
FIG. 4 illustrates the severe undercutting and resist lifting which occurred when the prior art etchants were used.
Figure 5:
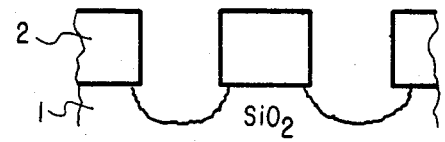
FIG. 5 illustrates the properly etched silicon dioxide resulting from a process using the etchant of the present invention.

With the mask in place, the chemical processing begins. Silicon dioxide may be removed where it is not protected by the photoresist using one of two methods, either a "dry" plasma etch or a "wet" etchant bath. When the prior art "wet" etchant bath is used, severe undercutting and resist lifting occurred as shown in FIG. 4. More desirable results are obtained, as illustrated in FIG. 5, when the silicon dioxide is etched with a process using the etchant of the present invention.

Etchant baths dissolve $SiO_2$ in dilute acidic fluoride solutions. Etch rates depend on the concentration $HF_2^-$ and HF, but not free fluoride ions. Ammonium fluoride is typically used as the source of fluoride ions. In addition, a complexing agent is added which acts as a source of hydrogen ions and as a buffer to stabilize the pH of the solution. The hydrogen ions combine with fluoride ions as described in the following equations to form $HF_2^-$ and HF:

$$K_1[HF] = [H^+][F^-]$$

$$K_2[HF_2^-] = [HF][F^-]$$

where $K_1$ and $K_2$ are constants depending on temperature and molar concentrations of the fluoride ions. The presence of hydrogen ions therefore controls the etch rate by controlling the concentration of $HF_2^-$ and HF.

In the prior art, acetic acid or hydrogen fluoride was predominately used as the complexing agent. Since the amount of undercutting and resist lifting which occurs during the etch process also depends upon the chemistry of the photoresist/oxide interface, VLSI processing involving a PCM technique encountered severe etch problems regardless of the proportion of the $NH_4F$ to HF in the etch bath. Acetic acid/$NH_4F$ solutions showed an improvement with respect to gross resist lifting, however severe undercutting was still a major problem. Further testing revealed that prior art techniques directed at improving resist adhesion would not work with PMMA. Normally, in order to increase the adhesion of a standard positive resist to a phosphorous silicon glass surface, the surface is first dried. Then an adhesion promoter, such as hexamethydisilizone, is applied in vapor phase. However, if this procedure is used with PMMA, adhesion is considerably reduced rather than enhanced. Adhesion is increased for a PMMA mask by first soaking the phosphorous silicon glass or other silicon dioxide surface in a hot bath of $H_2O$ and $H_2SO_4$ and then applying the adhesion promoter directly to the surface in liquid form. None of these prior art adhesion promotion techniques reduced the resist lifting and undercutting to the degree that was obtained by using the present invention. The complete reversal in approach between standard resists and PMMA is therefore evident in all areas of the IC process including resist adhesion and etchant chemistry. Optimization of all the above mentioned prior art parameters did not result in the desired uniform etching of the silicon dioxide.

The present invention discloses the development of a new etchant bath comprising a new organic complexing agent which reduces surface diffusion of the etchant into the resist, thereby resulting in symmetrical lateral etching and uniform patterns. The characteristics of the new complexing agent require that the agent should be an organic acid which is water soluble. The agent must also be available in very high purity and contain extremely low levels of trace metal contamination such as sodium, potassium, and iron which would contaminate the integrated circuit. Several acids which met the above criterion were tested, including: glutaric, tartaric, lactic, ascorbic and citric. Citric acid was selected as the new complexing agent because it met the above criteria and was easily dissolvable in $H_2O$, while having a very complex molecular structure which limited its ability to undercut or lift the PMMA resist layer 2.

A preferred embodiment of the present invention may be constructed by mixing 6600 ml of $H_2O$ with 1000 ml 40% aqueous Ammonium Fluoride and 550 gm Citric Acid. There is no evidence that the concentrations of the Ammonium Fluoride or Citric Acid affect the performance of the present invention with respect to resist lifting. The concentrations of these chemicals primarily affect the etch rate of the silicon dioxide. The etchant works effectively with a bath temperature varying from 14 to 20 degrees C. without any noticeable effect on resist lifting.

We claim:

1. An etchant solution for the dissolution of silicon dioxide, comprising:
   an aqueous solution of ammonium fluoride from about 1% to about 20% by volume; and
   citric acid from about 10 to about 200 grams per liter of aqueous solution.

2. A method of dissolving silicon dioxide, which comprises the step of exposing the silicon dioxide to an etchant solution comprising:
   an aqueous solution of ammonium fluoride from about 1% to about 20% by volume; and
   citric acid from about 10 to about 200 grams per liter of aqueous solution.

3. A method of dissolving silicon dioxide through a portable conformable resist mask, with a PMMA as the etch stop layer which comprises the step of exposing the silicon dioxide to an etchant solution comprising:
   an aqueous solution of ammonium fluoride from about 1% to about 20% by volume; and
   citric acid from about 10 to about 200 grams per liter of aqueous solution.

4. An improved method of photoetching a silicon dioxide or doped silicon dioxide using a photosensitive mask of the portable conformal mask type wherein a first resist is deposited on the substrate to produce a bottom resist layer having a substantially planar top surface, a second resist is deposited as a top resist layer producing a multilayer substrate coating having the bottom resist layer, producing a multilayer substrate coating having the bottom resist layer sandwiched between the silicon dioxide and the top resist layer, the top resist layer is exposed to light in a range in which the second resist is insensitive, said light having been passed through a mask to expose only selected portions of the top resist layer, the top layer is developed to produce a portable conformable mask, and the layers of the substrate coating other than the top resist layer are processed to replicate the pattern of this portable conformable mask into such layers and placing the silicon dioxide in an etchant bath to dissolve the silicon dioxide where it is left exposed by the mask, the improvement comprising:
   the etchant bath comprising:
      an aqueous solution of ammonium fluoride from about 1% to about 20% by volume; and
      citric acid from about 10 to about 200 grams per liter of aqueous solution.

* * * * *